(12) United States Patent
Izumi

(10) Patent No.: US 6,333,590 B1
(45) Date of Patent: Dec. 25, 2001

(54) ULTRASONIC TRANSDUCER HAVING LAMINATE STRUCTURE, ULTRASONIC PROBE AND PRODUCTION METHOD THEREOF

(75) Inventor: Mikio Izumi, Soka (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/393,977

(22) Filed: Sep. 10, 1999

(30) Foreign Application Priority Data

Sep. 11, 1998 (JP) .................................................. 10-274289

(51) Int. Cl.⁷ .................................................. H01L 41/04
(52) U.S. Cl. ............................................ 310/366; 310/358
(58) Field of Search .................................... 310/348, 358, 310/326, 334

(56) References Cited

U.S. PATENT DOCUMENTS

| | | | |
|---|---|---|---|
| 4,385,255 | * | 5/1983 | Yamaguchi .......................... 310/348 |
| 4,564,782 | * | 1/1986 | Ogawa .................................. 310/366 |
| 5,410,208 | * | 4/1995 | Walter .................................. 310/358 |

* cited by examiner

Primary Examiner—Nestor Ramirez
Assistant Examiner—Karen Addison
(74) Attorney, Agent, or Firm—Antonelli, Terry, Stout & Kraus, LLP

(57) ABSTRACT

An ultrasonic probe comprising, in an array form, ultrasonic oscillators of a laminate structure fabricated by alternately laminating oscillation element layers and electrode layers, wherein the number of laminate layers of each ultrasonic oscillator becomes greatest at the center and decreases step-wise towards peripheral portions in an elevation direction.

12 Claims, 3 Drawing Sheets

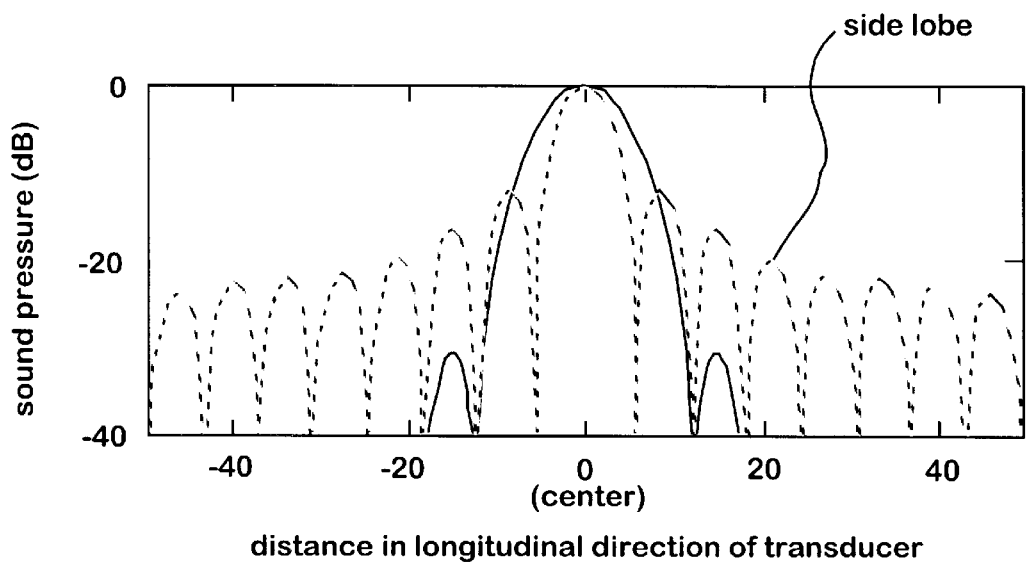

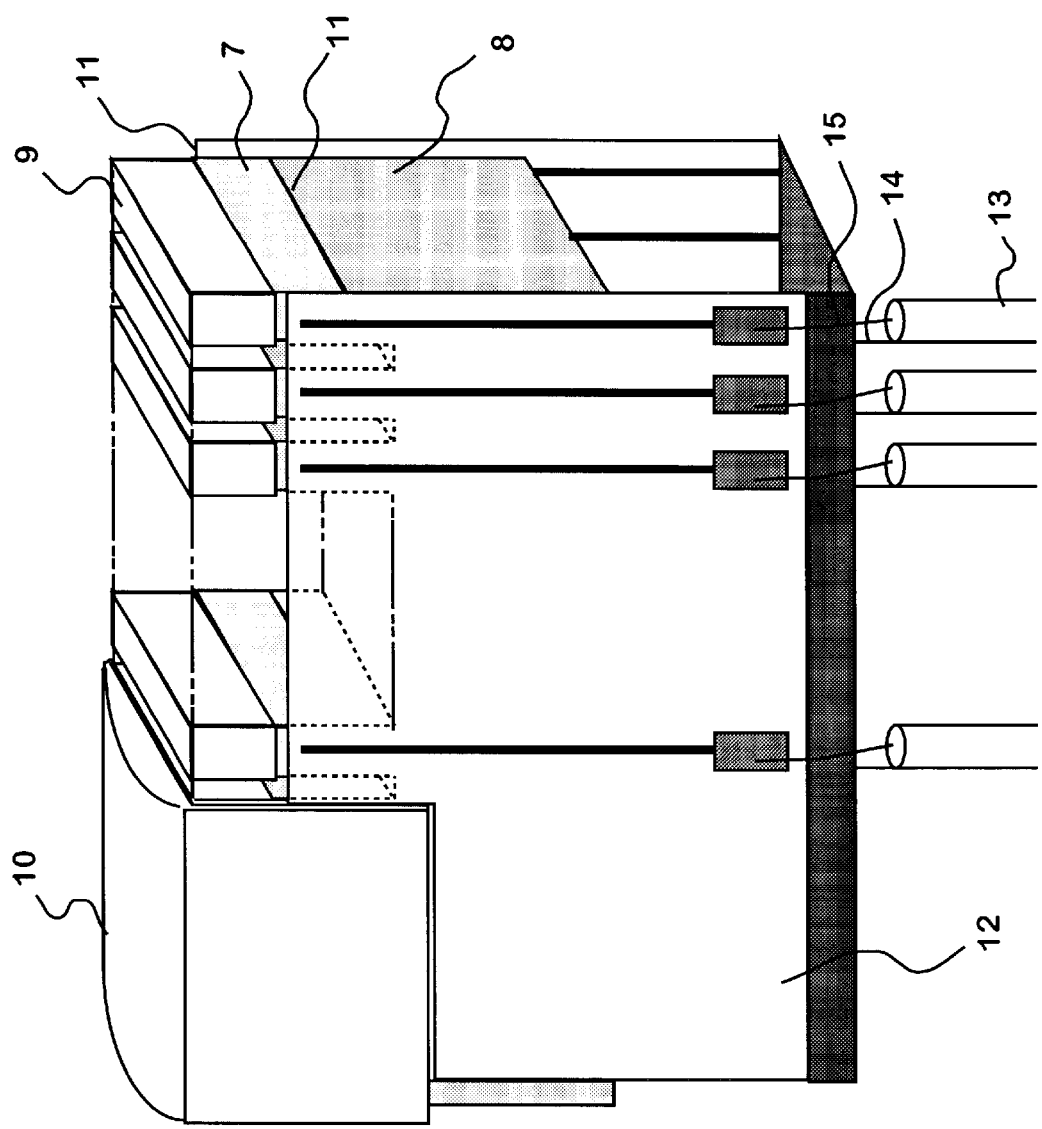

ULTRASONIC TRANSDUCER HAVING LAMINATE STRUCTURE, ULTRASONIC PROBE AND PRODUCTION METHOD THEREOF

BACKGROUND OF THE INVENTION

This invention relates to an ultrasonic transducer having a laminate structure, an array type ultrasonic probe formed by linearly arranging the transducers and a production method thereof.

The array type ultrasonic probe according to the prior art has the construction in which transducer elements made of a piezoelectric ceramic material are arranged in an array on a backing material, and a matching layer for establishing matching of acoustic impedance of an object or an acoustic lens is arranged in front of the transducers. The ultrasonic probe uses only one layer of the oscillation element or a laminate structure of a plurality of layers of oscillation elements (refer to "IEEE Transactions on Ultrasonics, Ferroelectrics, and Frequency Control", Vol. 43, No. 4, July 1996, pp620–622). In either of these layered structures of the prior art, electrodes opposing each other while interposing the piezoelectric material are so formed for each layer as to extend substantially in the same width from one end to the other in a longitudinal direction of the transducer element. When a pulse voltage is applied to such an electrode, the oscillation element undergoes thickness oscillation and generates ultrasonic waves. The sound pressure level of this ultrasonic wave exhibits a rectangular distribution that is substantially uniform from one end to the other of the transducer element.

However, considerably strong side lobes appear on both sides of a main beam in the ultrasonic beams emitted from the transducer having such a sound pressure distribution, as represented by broken lines in FIG. 3, as is known in the art. The signals generated from these side lobes mix as the noise with the signal obtained from the main lobe and reduce a signal-to-noise ratio (S/N) of the signal from the main lobe.

To reduce such detrimental side lobes, it is known to progressively reduce the ultrasound pressure level from the center towards both end portions. This means is described in "IEEE, 1985, Ultrasonics Symposium", 1985, pp793–799.

SUMMARY OF THE INVENTION

It is an object of the present invention to provide an ultrasonic transducer having a laminate structure for restricting the occurrence of side lobes to a low level, an ultrasonic probe, and a production method thereof.

It is another object of the present invention to provide an ultrasonic transducer having a laminate structure, that can be fabricated easily, an ultrasonic probe, and a production method thereof.

According to the present invention, an ultrasonic transducer is fabricated by laminating mutually and alternately a plurality of transducer elements and a plurality of internal electrodes into a laminate structure. In this instance, the size of each internal electrode having a simple shape such as a rectangle is changed in longitudinal direction of transducer so that the number of alternate laminate layers decreases from the center portion towards both end portions to thereby reduce level of side lobes.

An array type ultrasonic probe is fabricated by linearly arranging the ultrasonic transducers described above.

BRIEF DESCRIPTION OF THE DRAWINGS

FIG. 3 is a graph showing the sound pressure level of the ultrasonic wave with the longitudinal direction of the ultrasonic transducer shown in FIG. 1 being the abscissa; and FIG. 4 is a perspective view showing schematically the construction of a linear array type ultrasonic probe according to the present invention.

DETAILED DESCRIPTION OF THE INVENTION

Hereinafter, an embodiment of the present invention will be explained with reference to the accompanying drawings.

Figure 1:
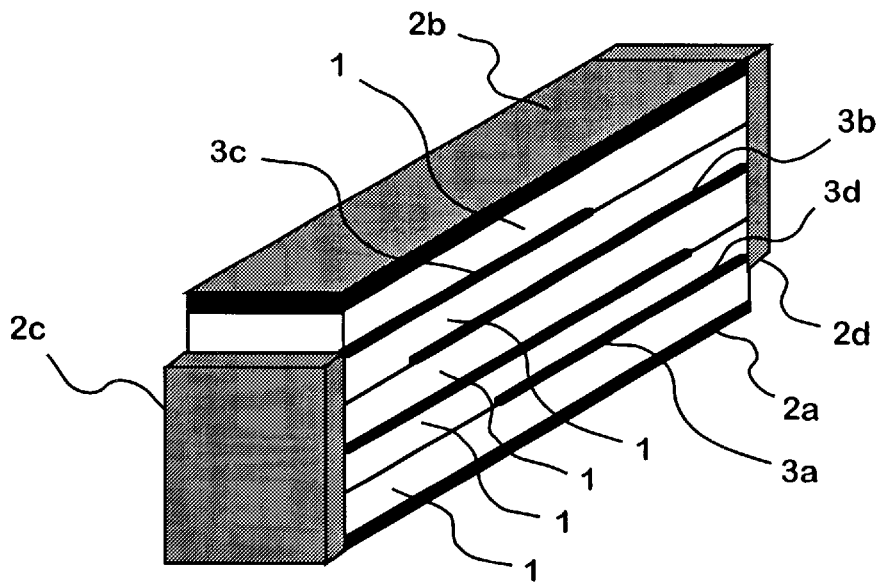
FIG. 1 is a perspective view of a transducer oscillator having a laminate structure according to the present invention.

FIG. 1 is a perspective view of an ultrasonic transducer according to the present invention, and shows the ultrasonic transducer having a laminate structure wherein transducer elements are laminated in five layers. In this drawing, reference numeral 1 denotes an piezoelectric element made of lead zirco-titanate type ceramics (hereinafter called "PZT") and having a piezoelectric effect. It is a raw soft green sheet of PZT before it is fired. Reference numerals 3a, 3b, 3c and 3d denote internal electrode layers. A predetermined area of the green sheet is printed in advance by palladium or platinum, and a plurality of green sheets so printed are laminated and fired to form the internal electrode layer. Reference numerals 2a, 2b, 2c and 2d denote external electrode layers formed by firing silver to four external surfaces of the transducer.

The uppermost internal electrode layer 3c and the lowermost internal electrode layer 3d in the transducer elements laminated in five layers have a rectangular shape, and are printed with a uniform width to about 5/7 of the full length in the longitudinal direction of the ultrasonic transducer. The internal electrode layer 3b of the second stage from the top and the internal electrode 3a of the second stage from the bottom have a rectangular shape, and are printed with a uniform width to about 6/7 of the full length in the longitudinal direction of the transducer. Furthermore, the internal electrodes 3a and 3c and the external electrode layer 2a on the bottom are electrically connected to the external electrode layer 2c on the left side surface in the drawing by firing silver. The internal electrode layers 3b and 3d and the external electrode layer 2b on the top are electrically connected to the external electrode layer 2d on the right side surface in the drawing by firing silver. Finally, the laminated oscillation elements are polarized by applying a high D.C. voltage between the outer electrodes to acquire piezoelectricity.

Figure 2:
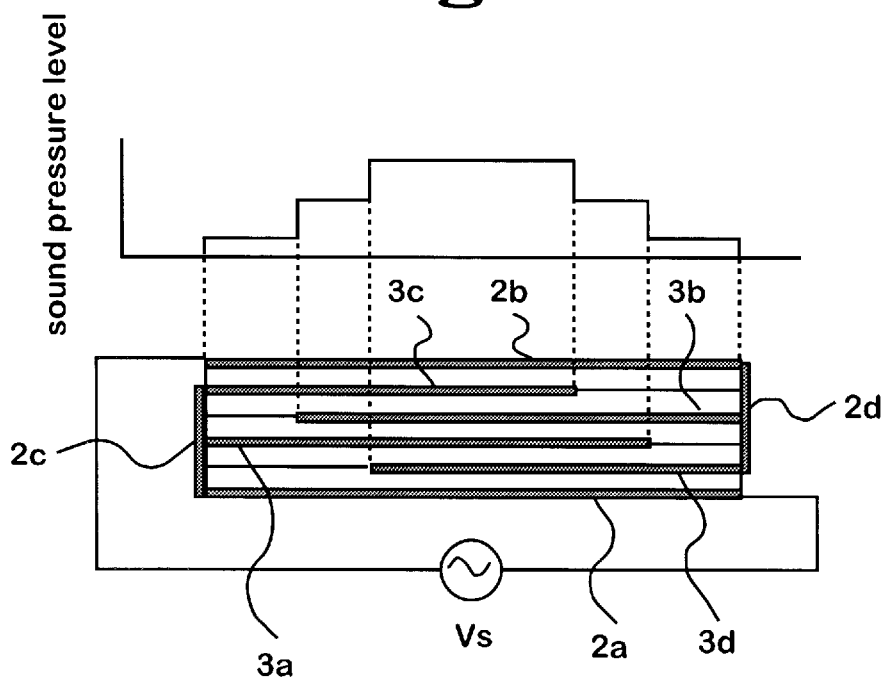
FIG. 2 is a structural view showing the sectional structure of the ultrasonic transducer shown in FIG. 1 in its longitudinal direction, and useful for explaining a distribution of sound pressure levels.

FIG. 2 is an explanatory view useful for explaining the sound pressure distribution in the longitudinal direction of the transducer when a voltage is applied to the ultrasonic transducer having the construction shown in FIG. 1. When an AC voltage Vs is applied across the upper and lower external electrodes 2a and 2b of the ultrasonic transducer in FIG. 2, an electric field is generated inside the oscillation elements.

The electric fields that are generated respectively in the oscillation element between the external electrode 2b and the internal electrode 3c, in the oscillation element between the internal electrodes 3b and 3a and in the oscillation element between the internal electrode 3d and the external electrode 2a have an opposite direction to the electric fields generated in the oscillation element between the internal electrodes 3c and 3b and in the oscillation element between the internal electrodes 3a and 3d. Polarization is formed in advance in the oscillation element in the developing direction of the electric field, and the oscillation elements are laminated so that their polarization is mutually opposite alternately. Each oscillation element undergoes extension in a thickness-wise direction when a voltage having the same polarity as the polarization is applied, and undergoes shrinkage, on the contrary, when a voltage having an opposite polarity to the polarization is applied. In consequence, each oscillation element undergoes oscillation in the thickness-wise direction by the application of the AC voltage.

The oscillation elements are laminated in such a fashion that the polarization becomes alternately and mutually opposite, and the voltages are applied in mutually opposite directions. Therefore, the extension/shrinkage of each oscillation element laminated has the same phase and reinforces mutually. Moreover, each oscillation element causes oscillation in the thickness-wise direction at the portion where the electric field develops, and does not cause oscillation at the portion where the electric field does not develop. Consequently, no oscillation occurs at the portion where the electric field does not develop. For these reasons, the level of the sound pressures generated by the ultrasonic transducer comprising the laminate of the oscillation elements is the superposition of the oscillation of each oscillation element. As shown in FIG. 2, the sound pressure level exhibits a Maximum at the center and decreases step-wise towards both ends by decreasing number of lamination stages. As a result, the occurrence of a side lobe can be reduced.

According to the present invention, the sound pressure distribution on the acoustic radiation plane of the ultrasonic transducer becomes higher towards the center and drops step-wise towards the peripheral portions, as shown in FIG. 2. In comparison with the prior art technology that provides an ultrasonic beam pattern generating a sound pressure distribution having a uniform intensity and a rectangular shape on the acoustic radiation plane, by disposing substantially uniformly the electrodes from an end to the other, the present invention can acquire the beam pattern having reduced side lobes, as shown in FIG. 3. This side lobe can be reduced not only when the ultrasonic wave is transmitted but also when an echo signal is received on the basis of exactly the same principle. Therefore, transmission of the ultrasonic waves in unnecessary directions other than in the target direction and reception of the echo signals from unnecessary directions can be eliminated, and a signal-to-noise ratio (S/N) of the received signals can be improved.

This embodiment uses PZT as the piezoelectric material of the oscillation elements, by way of example. However, the laminate of ordinary piezoelectric ceramics such as lead titanate, piezoelectric single crystals such as lead zinc-niobate and lead titanate, organic piezoelectric materials such as polyvinylidene fluoride, etc, can be used as the materials having similar piezoelectric effects. The materials of the electrode are those which have conductivity and have sufficient strength for forming the laminate, such as palladium, gold, silver, copper, nickel, solder, etc, and their alloys.

The number of laminate layers is five in the embodiment described above, but it may be smaller than five, such as three or four layers, or more than five, so long as the internal electrode layers are formed in such a fashion that the sound pressure is high at the center portion in the longitudinal direction of the transducer and drops step-wise towards the peripheral portions.

Next, an embodiment of a linear array type ultrasonic probe using the ultrasonic transducers according to the present invention will be explained with reference to FIG. 4. FIG. 4 is a perspective view of a linear array type probe, and like reference numerals are used in this drawing to identify like constituent elements as in FIG. 1.

In FIG. 4, reference numeral 7 denotes the laminate ultrasonic transducer shown in FIG. 1. Reference numeral 8 denotes a backing material, which is disposed at the back of the transducer 7 and so constituted as to broaden the frequency band by effecting mechanical damping. Reference numeral 9 denotes a matching layer, which establishes matching of acoustic impedance between an object and the ceramic oscillator. Reference numeral 10 denotes an acoustic lens for converging the ultrasonic waves in the longitudinal direction of the transducer element. Reference numeral 11 denotes an adhesive layer, which is used for bonding the laminate transducer 7 and matching layer 9, the backing material 8 and the laminate oscillator 7. Reference numeral 12 denotes a flexible printed circuit board for connecting the electrodes of transducer 7 and the coaxial cable 13. Reference numeral 13 denotes a coaxial cable for supplying the transmission voltage and picking out the receiving signal.

A production method of the ultrasonic probe shown in FIG. 4 will be explained. Each of the backing material 8, the laminate transducer 7 and the matching layer 9 is formed integrally in advance. The unitary laminate transducer is fabricated by laminating green sheets each having an electrode printed thereto into a plurality of layers and firing the resulting laminate.

The laminate transducer 7 may be fabricated by first forming a laminate of a sufficient number of single layer oscillator and then welding the electrode layers using a solder or other metals.

Next, the backing material 8, the laminate transducer 7 and the matching layer 9 are bonded and fixed to one another by the adhesive layers 11 and 11 comprising the epoxy type adhesive. The structure so formed is diced in the array direction as shown in the drawing, providing the array of the laminate type ultrasonic transducer isolated from one another in the linear arrangement. Therefore, the same laminate structure appears in the cut surface of each laminate transducer 7 formed by dicing.

Though the embodiment given above deals with the linear array type probe, a convex type probe may be fabricated by providing a radius of curvature in the array direction. In such a case, the probe can be shaped into the convex shape by applying suitable bending after dicing.

When the transmission voltage is applied from outside to the ultrasonic probe of the present invention having the construction described above, the number of layers that undergo mechanical transformation becomes greater towards the center portion in the longitudinal direction of the transducer element but decreases step-wise towards the peripheral portion. In consequence, the sound pressure distribution on the acoustic radiation plane of the probe becomes higher towards the center portion and becomes lower towards the peripheral portions. Therefore, the ultrasonic beam pattern of the ultrasonic probe of the present invention can reduce the sound pressure of the side lobes when compared with the conventional ultrasonic probes in which the sound pressure distribution is rectangular. This beam pattern can be improved not only when the ultrasonic waves are transmitted but also when the ultrasonic echoes are received, and the side lobes can be reduced. Furthermore, the sound waves in unnecessary directions other than the target direction can be reduced and the S/N ratio can be improved.

What is claimed is:

1. An ultrasonic transducer having a longitudinal direction, a width direction extending transversely to the longitudinal direction and a thickness direction extending transversely to the longitudinal direction and the width direction, comprising:

a plurality of oscillation element layers formed of a material having a piezoelectric effect;

a plurality of electrode layers formed and laminated mutually and alternately with said plurality of said oscillation element layers in the thickness direction of said ultrasonic transducer; and two conductors for connecting electrically and alternately said plurality of said electrode layers to mutually different polarities, and for receiving the supply of a voltage from an electric power source so as to enable said ultrasonic transducer to generate an ultrasonic wave;

wherein said electrode layers are constituted in such a fashion that an upper end electrode layer and a lower end electrode layer at both ends of said ultrasonic transducer in the thickness direction are respectively connected to the mutually different polarities and have the largest area of said plurality of electrode layers connected to the same polarity, and the area of the other of said plurality of electrode layers connected to the same polarity decreases in accordance with distance from the one of the upper end electrode layer and the lower end electrode layer connected to the same polarity, the number of said electrode layers becomes, the greatest at the center portion with respect to the longitudinal direction of said ultrasonic transducer and decreases from the center portion towards both side end portions thereof so as to reduce a side lobe on both sides of a main lobe.

2. An ultrasonic transducer according to claim 1, wherein said electrode layers are formed in substantially the same width as that of said oscillation element layers in the width direction which is perpendicular to the longitudinal direction of said ultrasonic transducer in plane view.

3. An ultrasonic transducer according to claim 1, wherein said electrode layers are shaped into a rectangular shape.

4. An ultrasonic probe including a plurality of ultrasonic transducers arranged in an array on a support, a matching layer disposed on an ultrasonic wave radiation surface side of said ultrasonic transducers and conductors for supplying a transmission voltage and picking up an echo signal to said ultrasonic transducers wherein said ultrasonic transducer has a longitudinal direction, a width direction extending transversely to the longitudinal direction and a thickness direction extending transversely to the longitudinal direction and the width direction, and comprises:

a plurality of oscillation element layers formed of a material having a piezoelectric effect;

a plurality of electrode layers formed and laminated mutually and alternately with a plurality of said oscillation element layers in the thickness direction of said ultrasonic transducer; and two conductors for connecting electrically and alternately a plurality of said electrode layers to mutually different polarities, respectively;

said electrode layers being constituted in such a fashion that an upper end electrode layer and a lower end electrode layer at both ends of said ultrasonic transducer in the thickness direction are respectively connected to the mutually different polarities and have the largest area of said plurality of electrode layers connected to the same polarity, and the area of the other of said plurality of electrode layers connected to the same polarity decreases in accordance with distance from the one of the upper end electrode layer and the lower end electrode layer connected to the same polarity, the number of said electrode layers becomes the greatest at a center portion with respect to the longitudinal direction of said ultrasonic transducer and decreases from the center portion towards both side end portions thereof so as to reduce a side lobe on both sides of a main lobe.

5. An ultrasonic probe according to claim 4, which further comprises an acoustic lens for converging the ultrasonic waves in a direction which is perpendicular to the longitudinal direction of the transducer, said acoustic lens being disposed on an ultrasonic wave radiation surface of said matching layer.

6. An ultrasonic probe according to claim 4, wherein said support is a backing material having a mechanical damping function for broadening a frequency band.

7. An ultrasonic transducer having a longitudinal direction, a width direction extending transversely to the longitudinal direction and a thickness direction extending transversely to the longitudinal direction and the width direction, comprising:

a plurality of oscillation element layers formed on a material having a piezoelectric effect;

a plurality of electrode layers formed and laminated mutually and alternately with a plurality of said oscillation element layers in the thickness direction of said ultrasonic transducer;

two conductors for connecting electrically to said plurality of electrode layers in mutually different polarities, and for applying transmission voltage from an electric power source to said electrode layers so as to enable said ultrasonic transducer to generate an ultrasonic wave with a main lobe and a side lobe on both sides of the main lobe; and means for reducing the side lobe generated on both sides of the main lobe when the ultrasonic transducer is driven to generate the ultrasonic wave;

wherein said means for reducing the side lobe includes arranging said electrode layers such that an upper end electrode layer and a lower end electrode layer at both ends of said ultrasonic transducer in the thickness direction are respectively connected to the mutually different polarities and have the largest area of said plurality of electrode layers connected to the same polarity, and the area of others of said plurality of electrode layers connected to the same polarity decreases in accordance with distance from the one as the upper end electrode layer and the lower end electrode layer connected to the same polarity.

8. An ultrasonic transducer having a longitudinal direction, a width direction extending transversely to the longitudinal direction and a thickness direction extending transversely to the longitudinal direction and the width direction, comprising:

a plurality of oscillation element layers formed on a material having a piezoelectric effect;

a plurality of electrode layers formed and laminated mutually and alternately with a plurality of said oscillation element layers in the thickness direction of said ultrasonic transducer;

two conductors for connecting electrically to said plurality of electrode layers in mutually different polarities, and for applying transmission voltage from an electric power source to said electrode layers so as to enable said ultrasonic transducer to generate an ultrasonic wave; and means for forming a sound pressure distribution on an acoustic radiation plane of the ultrasonic transducer such that a sound pressure level of a center portion of the transducer is higher than that of both end portions thereof;

wherein said means for forming the sound pressure distribution includes arranging said electrode layers such that an upper end electrode layer and a lower end electrode layer at both ends of said ultrasonic transducer in the thickness direction are respectively connected to the mutually different polarities and have the largest area of said plurality of electrode layers connected to the same polarity, and the area of others of said plurality of electrode layers connected to the same polarity decreases in accordance with distance from the one as the upper end electrode layer and the lower end electrode layer connected to the same polarity.

9. An ultrasonic transducer having a longitudinal direction, a width direction extending transversely to the longitudinal direction and a thickness direction extending transversely to the longitudinal direction and the width direction, comprising:

a plurality of oscillation element layers formed on a material having a piezoelectric effect;

a plurality of electrode layers formed and laminated mutually and alternately with a plurality of said oscillation element layers in the thickness direction of said ultrasonic transducer;

two conductors for connecting electrically to said plurality of electrode layers to mutually different polarities, and for applying transmission voltage from an electric power source to said electrode layers so as to enable said ultrasonic transducer to generate an ultrasonic wave;

wherein said plurality of electrodes layers are formed such that an upper end electrode layer and a lower end electrode layer at both ends of said ultrasonic transducer in the thickness direction are respectively connected to the mutually different polarities and have the largest area of said plurality of electrode layers connected to the same polarity, and the area of others of said plurality of electrode layers connected to the same polarity decreases in accordance with distance from the one as the upper end electrode layer and the lower end electrode layer connected to the same polarity a sound pressure level of the center portion of the transducer at least in the longitudinal direction is higher than that of both side end portions thereof.

10. An ultrasonic transducer having a longitudinal direction, a width direction extending transversely to the longitudinal direction and a thickness direction extending transversely to the longitudinal direction and the width direction, comprising:

a plurality of oscillation element layers formed of a piezoelectric material layers laminated alternately with a plurality of electrode layers in the thickness direction;

said each electrode layer being formed such that an upper end electrode layer and a lower end electrode layer at both ends of said ultrasonic transducer in the thickness direction are respectively connected to the mutually different polarities and have the largest area of said plurality of electrode layers connected to the same polarity, and the area of others of said plurality of electrode layers connected to the same polarity decreases in accordance with distance from the one as the upper end electrode layer and the lower end electrode layer connected to the same polarity, a sound pressure level of a center portion of the transducer at least in the longitudinal direction is higher than that of both side end portions thereof, and two conductors for connecting electrically to different polarities adjacent ones of said plurality of said electrode layers.

11. An ultrasonic transducer according to claim 7, wherein each of said two conductors electrically connects an alternate adjacent one of said plurality of electrode layers.

12. An ultrasonic transducer according to claim 8, wherein each of said two conductors electrically connects an alternate adjacent one of said plurality of electrode layers.

* * * * *